United States Patent [19]
Lee

[11] Patent Number: 5,880,039
[45] Date of Patent: Mar. 9, 1999

[54] METHOD FOR FORMING INTERLAYER INSULATING FILM OF A SEMICONDUCTOR DEVICE

[75] Inventor: Sahng Kyoo Lee, Kyoungki-do, Rep. of Korea

[73] Assignee: Hyundai Electronics Industries Co., Ltd., Kyoungki-do, Rep. of Korea

[21] Appl. No.: 847,256

[22] Filed: May 1, 1997

[30] Foreign Application Priority Data

May 22, 1996 [KR] Rep. of Korea ............... 1996 17357

[51] Int. Cl.[6] .................................................. H01L 21/02
[52] U.S. Cl. .................... 438/763; 438/763; 438/760; 438/624; 438/631; 438/633; 438/692; 438/698
[58] Field of Search ................................. 438/789, 790, 438/780, 760, 761, 762–763, 624, 631, 632, 633, 634, 692, 699, 698

[56] References Cited

U.S. PATENT DOCUMENTS

| | | | |
|---|---|---|---|
| 4,545,852 | 10/1985 | Barton ................................ | 438/699 |
| 4,972,251 | 11/1990 | Lehrer ................................ | 357/54 |
| 5,166,093 | 11/1992 | Grief . | |
| 5,268,333 | 12/1993 | Lee et al. .......................... | 438/760 |
| 5,278,103 | 1/1994 | Mallon et al. .................... | 438/760 |
| 5,286,681 | 2/1994 | Maeda et al. ..................... | 438/760 |
| 5,356,513 | 10/1994 | Burke et al. ...................... | 438/633 |
| 5,494,854 | 2/1996 | Jain . | |
| 5,516,729 | 5/1996 | Dawson et al. ................... | 438/698 |
| 5,518,962 | 5/1996 | Murao ............................... | 438/699 |
| 5,532,191 | 7/1996 | Nakano et al. ................... | 438/699 |
| 5,545,585 | 8/1996 | Wang et al. ....................... | 438/397 |
| 5,552,346 | 9/1996 | Huang et al. ..................... | 438/699 |
| 5,600,165 | 2/1997 | Tsukamoto et al. .............. | 257/323 |
| 5,656,556 | 8/1997 | Yang ................................. | 438/646 |
| 5,716,890 | 2/1998 | Yao ................................... | 438/624 |
| 5,726,097 | 3/1998 | Yanagida .......................... | 438/622 |
| 5,726,497 | 3/1998 | Chao et al. ....................... | 438/688 |
| 5,770,469 | 12/1998 | Uram et al. ....................... | 1/1 |

*Primary Examiner*—Charles Bowers
*Assistant Examiner*—Thanh Nguyen
*Attorney, Agent, or Firm*—Gary M. Nath; Harold L. Novick; Nath & Associates

[57] ABSTRACT

A method for forming an interlayer insulating film of semiconductor device is disclosed. A first interlayer insulating film is deposited on the entire top surface of a semiconductor device comprising a high step cell area and lower step periphery area, followed by the thermal treatment thereof. A second interlayer insulating film which is more resistant to etch than the first interlayer insulating film is deposited. Again, a third interlayer insulating film is deposited over the second interlayer insulating film, followed by the heat treatment thereof. These interlayer insulating films are planarized by a CMP process. Upon the CMP process, the first interlayer insulating film is rapidly etched out while the second interlayer insulating film is slowly removed and this difference in etching rate allows the polishing end point to be readily detected without an additional detector. Thus, the lower step periphery area can be prevented from being over-polished, so that a wholly planar structure free of the dishing problem can be obtained, thus facilitating the subsequent processes.

20 Claims, 2 Drawing Sheets

METHOD FOR FORMING INTERLAYER INSULATING FILM OF A SEMICONDUCTOR DEVICE

BACKGROUND OF THE INVENTION

1. Field of the Invention

The present invention relates, in general, to a method for forming an interlayer insulating film of a semiconductor device and, more particularly, to the use of a high density plasma oxide film as a polishing retarder upon chemical mechanical polishing for the planarization of the interlayer insulating film.

2. Description of the Prior Art

The high step of semiconductor device, which is primarily created by the result of highly integrated semiconductor elements, probably causes so-called notching, a pattern defective problem resulting from the diffused reflection in the lithography process. It makes it difficult to progress to the subsequent process.

In order to solve this problem, planarizing techniques of burying the high step coverage with an insulating material have been suggested. These planarizing techniques are now considered to be a very important process in the high integration of a semiconductor device because they facilitate the subsequent processes.

Typically, in order to planarize a semiconductor device with high step coverage, a borophospho silicate glass (hereinafter referred to as "BPSG") film doped with high density boron (B) and phosphorous (P) is used, followed by treating it at high temperature.

However, this planarization process employing BPSG film still causes the notching problem in fabricating semiconductor devices with high integration degree, such as 256M DRAM or more, in which the step coverage between the cell area and the periphery area is maintained at a height of 0.8–1.0 $\mu$m.

In addition, as metal wires are required to be narrower in semiconductor devices, a stepper employing shorter wave, such as deep UV, as a light source, is used for the photolithography thereof. However, the focus depth of such stepper becomes as small as about 0.4 $\mu$m, which makes it impossible to form a photoresist pattern for metal wires. Although the photoresist pattern is formed, when it is used as a mask in a metal wiring process, either the resultant metal wires are likely to be intermitted or a bridge problem occurs. Here, the focus depth is defined as follows in order to forming a pattern on a wafer through an optical lens by use of an exposure mask. When a focus is brought into the wafer, virtual images appear on the upper and lower loci of the wafer based on the center of the lens. That is, the focus depth is twice of the length between the lens and the image nearest the lens.

A different method has been developed to overcome the above-mentioned difficulties in highly integrating semiconductor elements. A chemical mechanical polishing (hereinafter referred to as "CMP") technique using chemical slurry is currently used to polish and planarize the high step coverage.

A description of a conventional CMP technique with reference to FIGS. 1 and 2 will be given, in order to better understand the background of the invention.

First, as shown in FIG. 1, a semiconductor substrate 1 is prepared on which an infrastructure 3 is fabricated. It is obtained by forming a field oxidation film to separate semiconductor elements, forming a gate electrode, providing a source/drain electrode and forming a bit line and a capacitor. These are omitted in FIGS. 1 and 2 for convenience.

Then, a BPSG film 5 having about 1000 Angstrom thick, which is thicker than the step coverage between a cell area 100 and a periphery area 200, is deposited on the infrastructure 3, followed by the heat treatment of the BPSG film 5 at 800° C. or higher.

Next, as shown in FIG. 2, a CMP process is executed to etch the BPSG film 5 for the planarization of the upper structure. At this time, the etching is effected on the periphery area 200 as well as the cell area 100. Therefore, although the step coverage denoted by "B" in FIG. 2 is smaller than the step denoted by "A" in FIG. 1, it still exists after the CMP process.

As described above, the CMP process allows the step coverage to be reduced by thickly depositing the BPSG film and mechanically polishing it with chemical reagent. However, owing to the CMP process's dishing effect that the cell area is polished along with the periphery area, it is difficult to obtain whole planarization and thus, the subsequent steps can not be processed smoothly. As a result, many problems arise, including difficulty in the high integration of a semiconductor device and degradation in the properties and the reliability of the semiconductor device thus obtained.

Since only a certain thickness of the BPSG film is polished, the conventional CMP additionally requires an end point detector, such as a detector for sensing the current change with motor speed or a detector of optical type. The point detects a factor in increasing the process cost of a semiconductor device. Moreover, the protocol to operate the detector adds complexity to the overall manufacture processing of a semiconductor device, resulting in a decrease in productivity.

SUMMARY OF THE INVENTION

An objective of the present invention is to overcome the above problems encountered with prior arts and to provide a method for forming an interlayer insulating film of a semiconductor device which enables a significant improvement in the properties, reliability, productivity and high integration of a semiconductor device to be achieved.

In accordance with a first aspect of the present invention, a method for forming an interlayer insulating film of semiconductor device is provided and comprises the steps of providing a semiconductor substrate formed a lower structure layer on the cell and periphery areas; forming a first interlayer insulating film over the entire top surface of the lower structure layer and thermally treating the first interlayer insulating film; depositing a second interlayer insulating film over the first interlayer insulating film; depositing a third interlayer insulating film over the second interlayer insulating film and thermally treating the third interlayer insulating film; and subjecting to the first, the second and the third interlayer insulating films to etch for planarization.

In accordance with another aspect of the present invention, a method for forming an interlayer insulating film of semiconductor device is provided and comprises the steps of: providing a semiconductor substrate formed a lower structure layer on the cell and periphery areas; forming a first borophospho silicate glass (BPSG) insulating film over the entire top surface of the lower structure layer and thermally treating the first BPSG insulating film; depositing a high density plasma oxide film over the first BPSG interlayer insulating film; depositing a second BPSG over the high density plasma oxide film and thermally treating the second BPSG interlayer insulating film; and etching the first BPSG interlayer insulating film, the high density plasma oxide film and the second BPSG interlayer insulating film for planarization by use of a chemical mechanical polishing technique.

BRIEF DESCRIPTION OF THE DRAWINGS

Other objectives and aspects of the invention will become apparent from the following description of embodiments with reference to the accompanying drawings in which.

DETAILED DESCRIPTION OF PREFERRED EMBODIMENTS

Figure 1:
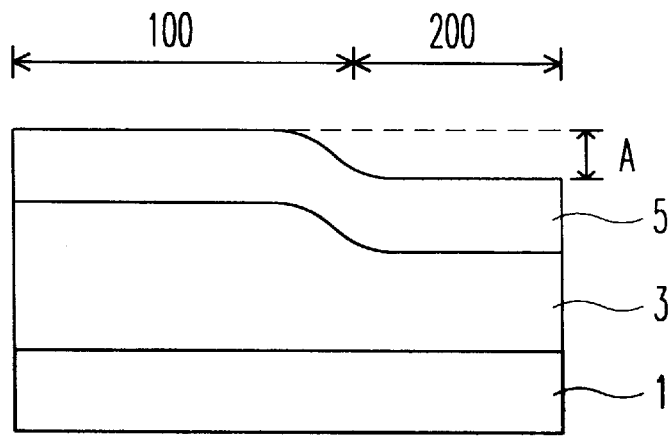
FIGS. 1 and 2 are schematic cross sectional views showing a conventional technique for forming an interlayer insulating film of a semiconductor device.
Figure 2:
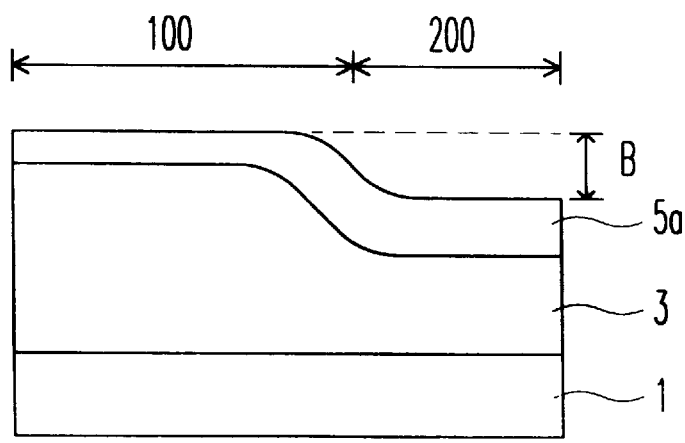

The application of the preferred embodiments of the present invention is best understood with reference to the accompanying drawings, wherein like reference numerals are used for like and corresponding parts, respectively.

Figure 3:
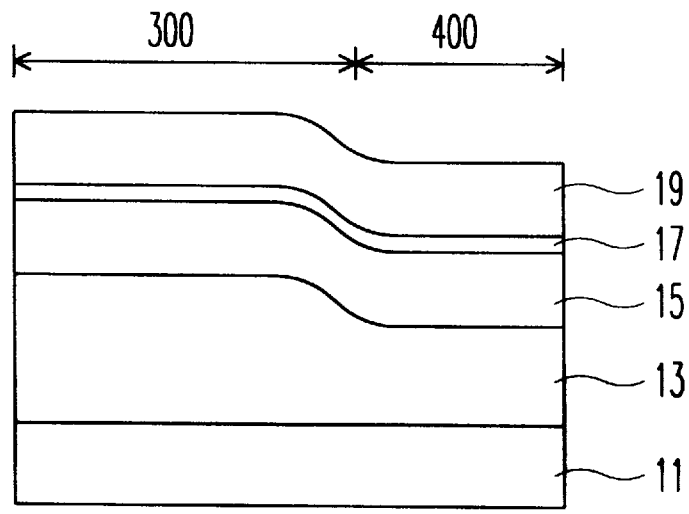
FIGS. 3 and 4 are schematic cross sectional views showing a method for forming an interlayer insulating film of a semiconductor device, according to the present invention.
Figure 4:
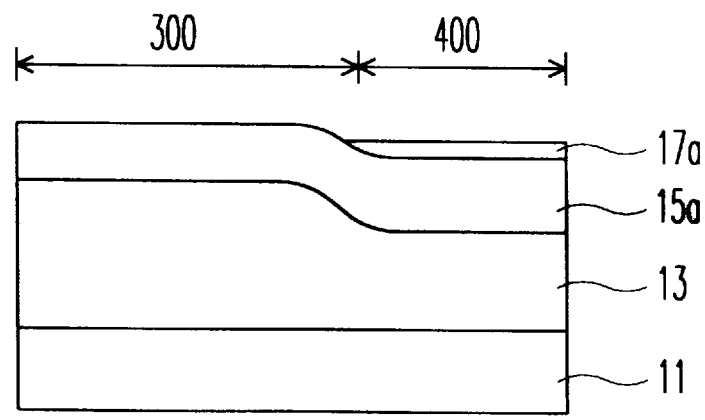

Referring to FIGS. 3 and 4, the processes for forming an interlayer insulating film of semiconductor device in accordance with the present invention are illustrated.

As shown in FIG. 3, a semiconductor-substrate 11 is prepared on which an infrastructure 13 is established including a field oxide film for separating elements, a gate electrode, source/drain electrode, a bit line and a capacitor, all of which are not shown.

Then, a first BPSG insulating film 15 about 1000–5000 Angstrom thick, which is thicker than the step coverage between a cell area 300 and a periphery area 400, is deposited as a first interlayer insulating film, on the top surface of the infrastructure 13. Alternatively, instead of the first BPSG insulating film 15, a BSG film or other insulating films may be used. For example, an $O_3$-TEOS silicon oxide film may be deposited using atmosphere-pressure chemical vapor deposition (APCVD) or low-pressure chemical vapor deposition (LPCVD). Further, an silicon oxide film deposited through plasma-enhanced chemical vapor deposition (PECVD) may replace the first BPSG insulating film 15.

A thermal treatment at about 700°–900° C. is carried out to stabilize the first BPSG insulating film 15.

Subsequently, a high density plasma oxide film 17 as a second interlayer insulating film is deposited at a thickness of about 500–3000 Angstrom over the resulting structure. To the end, an electron cyclotron resonance (ECR) chemical vapor deposition technique, a helicon wave CVD technique or an inductive coupled plasma (ICP) CVD technique is used.

Thereafter, a second BPSG insulating film 19 with a thickness of about 2,000–10,000 is deposited as a third interlayer insulating film over the high density plasma oxide film 17 with the plasma density ranging from about $10^{10}$–$10^{12}$ ions/cm$^2$ followed by the thermal treatment of the second BPSG insulating film 19 at 700°–900° C. for stabilization.

Next, as shown in FIG. 4, a CMP process is executed to planarize the cell area 300 and the periphery area 400. In this case, the high density plasma oxide film 17 serves as a stopping layer which is more resistant to polishing than the BPSG film 15, so that the dishing phenomenon does not occur.

In accordance with the present invention, the CMP process is carried out under the condition that 5–7 psi is set for the pressure of the polishing head, 20–50 rpm for the rotational speed, 15–40 rpm for the table speed of the platen, and 0–2 psi for the back-pressure of the polishing head. As a suspension chemical, an alkaline solution, such as KOH or $NH_4OH$, is used to prevent the polishing grains from aggregating into larger granules or precipitating.

As illustrated hereinbefore, the method for forming an interlayer insulating film of semiconductor device in accordance with the present invention is characterized by taking advantage of a high density plasma oxide film in a CMP process. When a stacking structure consisting of the first BPSG insulating film, the high density plasma oxide film and the second BPSG insulating film is subjected to a CMP process, the oxide film is slowly removed while the BPSG insulating films are rapidly done and thus, this difference in etching rate allows the polishing end point to be readily detected. Additionally, the lower step periphery area can be prevented from being over-polished, so that a wholly planar structure free of the dishing problem can be obtained, thereby facilitating the subsequent processes. Consequently, the present invention has the significant advantages of improving the reliability and productivity of a semiconductor device and achieving the high integration of a semiconductor device.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other than those specifically described.

What is claimed is:

1. A method for forming an interlayer insulating film of a semiconductor device, comprising the steps of:

providing a semiconductor substrate having a lower structure layer with a cell area and a periphery area;

forming a first borophospho silicate glass interlayer insulating film over the entire top surface of the lower structure layer and thermally treating the first borophospho silicate glass interlayer insulating film at a temperature of about 700° C.–900° C.;

forming a high density plasma oxide film over the first borophospho silicate glass interlayer insulating film;

forming a second borophospho silicate glass interlayer insulating film over the high density plasma oxide film and thermally treating the second borophospho silicate glass interlayer insulating film at a temperature of about 700° C.–900° C.; and subjecting the first and second borophospho silicate interlayer glass insulating films and the high density plasma oxide film to etch for planarization.

2. A method in accordance with claim 1, wherein said first interlayer insulating film is formed of a borophospho silicate glass film.

3. A method in accordance with claim 1, wherein said first borophospho silicate glass interlayer insulating film is formed by use of an atmosphere pressure chemical vapor deposition technique.

4. A method in accordance with claim 1, wherein said first borophospho silicate glass interlayer insulating film is formed by use of a low pressure chemical vapor deposition technique.

5. A method in accordance with claim 1, wherein said first borophospho silicate glass interlayer insulating film is formed by use of a plasma enhanced chemical vapor deposition technique.

6. A method in accordance with claim 1, wherein said first borophospho silicate glass interlayer insulating film is deposited at a thickness of about 1,000 Angstroms–5,000 Angstroms.

7. A method in accordance with claim 1, wherein said first interlayer insulating film is thermally treated at a temperature of about 700°–900° C.

8. A method in accordance with claim 1, wherein said high density plasma oxide film is formed by use of an electron cyclotron resonance chemical vapor deposition technique and has a plasma density ranging from about $10^{10}$ to $10^{12}$ ions/cm$^2$.

9. A method in accordance with claim 1, wherein said high density plasma oxide film is formed by use of a helicon wave chemical vapor deposition technique.

10. A method in accordance with claim 1, wherein said high density plasma oxide film is formed by use of an inductive coupled plasma chemical vapor deposition technique.

11. A method in accordance with claim 1, wherein said high density plasma oxide film is formed at a thickness of about 500 Angstroms–3,000 Angstroms.

12. A method in accordance with claim 1, wherein said third interlayer insulating film is formed of a borophospho silicate glass film.

13. A method in accordance with claim 1, wherein said second borophospho silicate glass interlayer insulating film is formed by use of an atmosphere pressure chemical vapor deposition technique.

14. A method in accordance with claim 1, wherein said second borophospho silicate glass interlayer insulating film is formed by use of a low pressure chemical vapor deposition technique.

15. A method in accordance with claim 1, wherein said second borophospho silicate glass interlayer insulating film is formed by use of a plasma enhanced chemical vapor deposition technique.

16. A method in accordance with claim 1, wherein said second borophospho silicate glass interlayer insulating film is deposited at a thickness of about 2,000 Angstroms–10,000 Angstroms.

17. A method in accordance with claim 1, wherein said etch step is carried out by a chemical mechanical polishing process.

18. A method in accordance with claim 17, wherein said chemical mechanical polishing process is carried out under the condition that 5–7 psi is set for the pressure of a polishing head, 20–50 rpm for the rotational speed, 15–40 rpm for the table speed of a platen, and 0–2 psi for the back-pressure of the polishing head.

19. A method in accordance with claim 17, wherein said chemical mechanical polishing process is carried out by using an alkaline suspension of either KOH or NH$_4$OH.

20. A method for planarizing an interlayer insulating film of a semiconductor device, comprising the steps of:
   providing a semiconductor substrate having a lower structure layer with a cell area and a periphery area;
   forming a first borophospho silicate glass interlayer insulating film over the entire top surface of the lower structure layer and thermally treating the first borophospho silicate glass interlayer insulating film at a temperature of about 700° C.–900° C.;
   depositing a high density plasma oxide film over the first borophospho silicate glass interlayer insulating film, said oxide film having a plasma density of about $10^{10}$–$10^{12}$ ions/cm$^2$;
   depositing a second borophospho silicate glass interlayer insulating film over the high density plasma oxide film and thermally treating the second borophospho silicate glass interlayer insulating film at a temperature of about 700° C.–900° C.; and
   etching the first borophospho silicate glass interlayer insulating film, the high density plasma oxide film and the second borophospho silicate glass interlayer insulating film for planarization by use of a chemical mechanical polishing technique.

* * * * *

UNITED STATES PATENT AND TRADEMARK OFFICE
CERTIFICATE OF CORRECTION

PATENT NO. : 5,880,039
DATED : March 9, 1999
INVENTOR(S) : Sahng Kyoo Lee

It is certified that error appears in the above-identified patent and that said Letters Patent is hereby corrected as shown below:

Cancel claims 2, 7 and 12.

Signed and Sealed this

Second Day of November, 1999

Attest:

Q. TODD DICKINSON

*Attesting Officer*    *Acting Commissioner of Patents and Trademarks*